(12) United States Patent
Hiramatsu et al.

(10) Patent No.: US 7,608,891 B2
(45) Date of Patent: Oct. 27, 2009

(54) THIN FILM TRANSISTOR, CIRCUIT APPARATUS AND LIQUID CRYSTAL DISPLAY

(75) Inventors: Masato Hiramatsu, Tokyo (JP); Masakiyo Matsumura, Kanagawa (JP); Mikihiko Nishitani, Nara (JP); Yoshinobu Kimura, Tokyo (JP); Yoshitaka Yamamoto, Nara (JP)

(73) Assignee: Kabushiki Kaisha Ekisho Sentan Gijutsu Kaihatsu Center, Kanagawa (JP)

( * ) Notice: Subject to any disclaimer, the term of this patent is extended or adjusted under 35 U.S.C. 154(b) by 245 days.

(21) Appl. No.: 11/469,748

(22) Filed: Sep. 1, 2006

(65) Prior Publication Data

US 2007/0023759 A1     Feb. 1, 2007

(51) Int. Cl.
*H01L 27/01* (2006.01)
(52) U.S. Cl. .................. 257/347; 257/401; 257/72; 257/369; 257/773; 257/775
(58) Field of Classification Search .............. 257/347, 257/401, 72, 369, 773, 775
See application file for complete search history.

(56) References Cited

U.S. PATENT DOCUMENTS 5,385,865 A    1/1995    Nieder et al. ............... 437/133

6,770,936 B2 *    8/2004    Inoue et al. .................. 257/347
6,806,498 B2    10/2004    Taketomi et al. ............... 257/1

FOREIGN PATENT DOCUMENTS

| JP | 57-172770 | 10/1982 |
|---|---|---|
| JP | 62-45070 | 2/1987 |
| JP | 05-048095 | 2/1993 |
| JP | 2000-133807 | 5/2000 |

OTHER PUBLICATIONS

The first Official Action issued against the corresponding application in China. (Chinese Language) Feb. 9, 2007.

* cited by examiner

*Primary Examiner*—Long Pham
(74) *Attorney, Agent, or Firm*—Stoel Rives LLP

(57) ABSTRACT

A thin film transistor includes a one conductive type semiconductor layer (11); a source region (12) and a drain region (13) which are separately provided in the semiconductor layer; and a gate electrode (14) provided above or below the semiconductor layer with an insulating film interposed therebetween, wherein the width ($W_s$) of the junction face between the source region and the channel (16) which is provided between the source region and drain region, is different from the width ($W_d$) of the junction face between the above channel region and the drain region.

4 Claims, 15 Drawing Sheets

Prior Art

FIG. 11
(a)
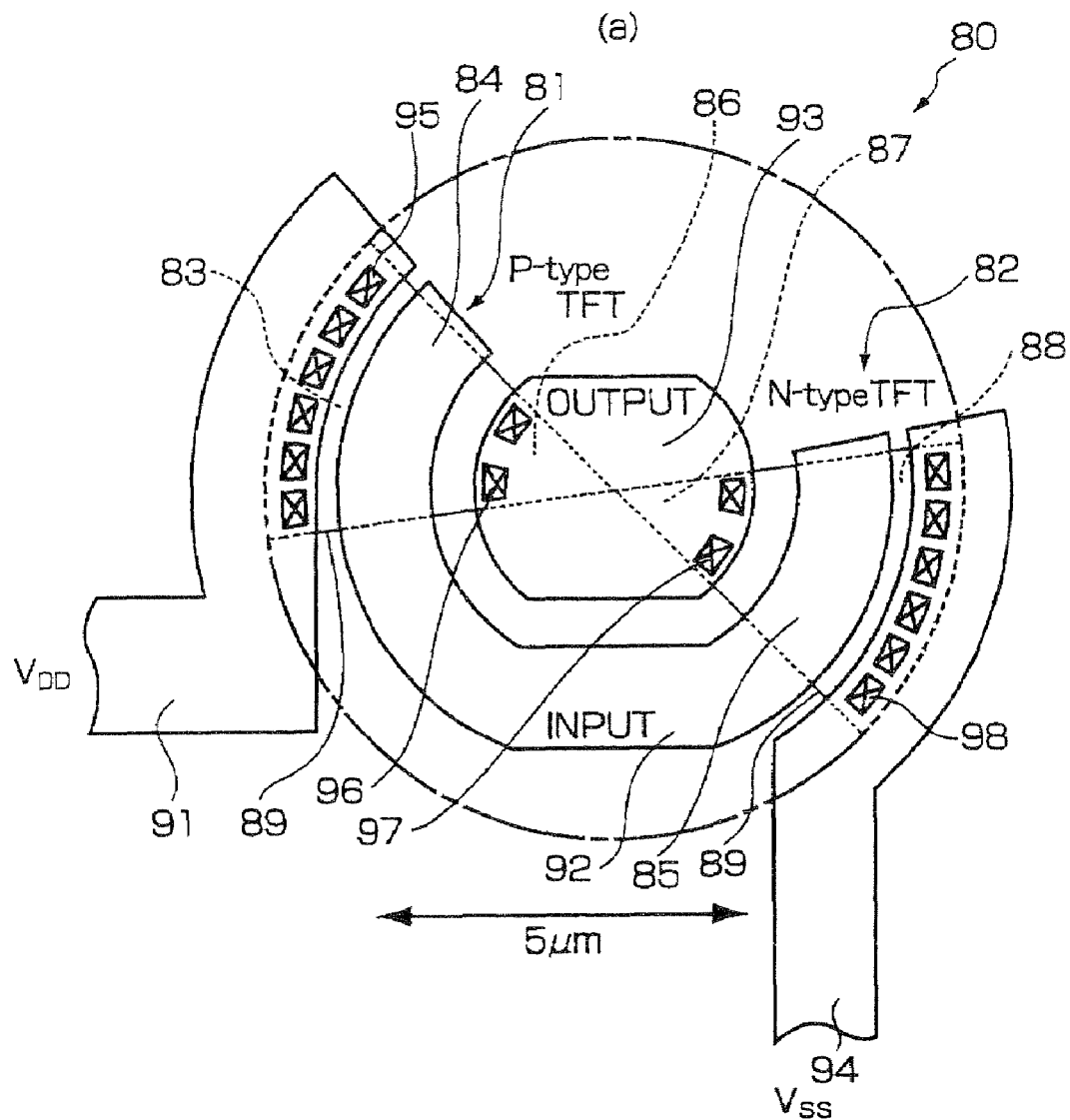
(b)
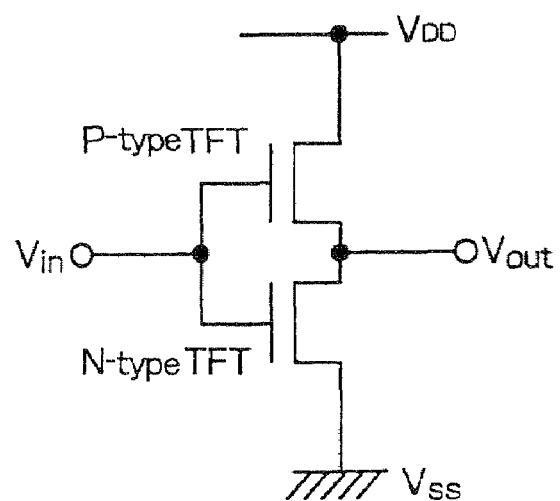

FIG. 13
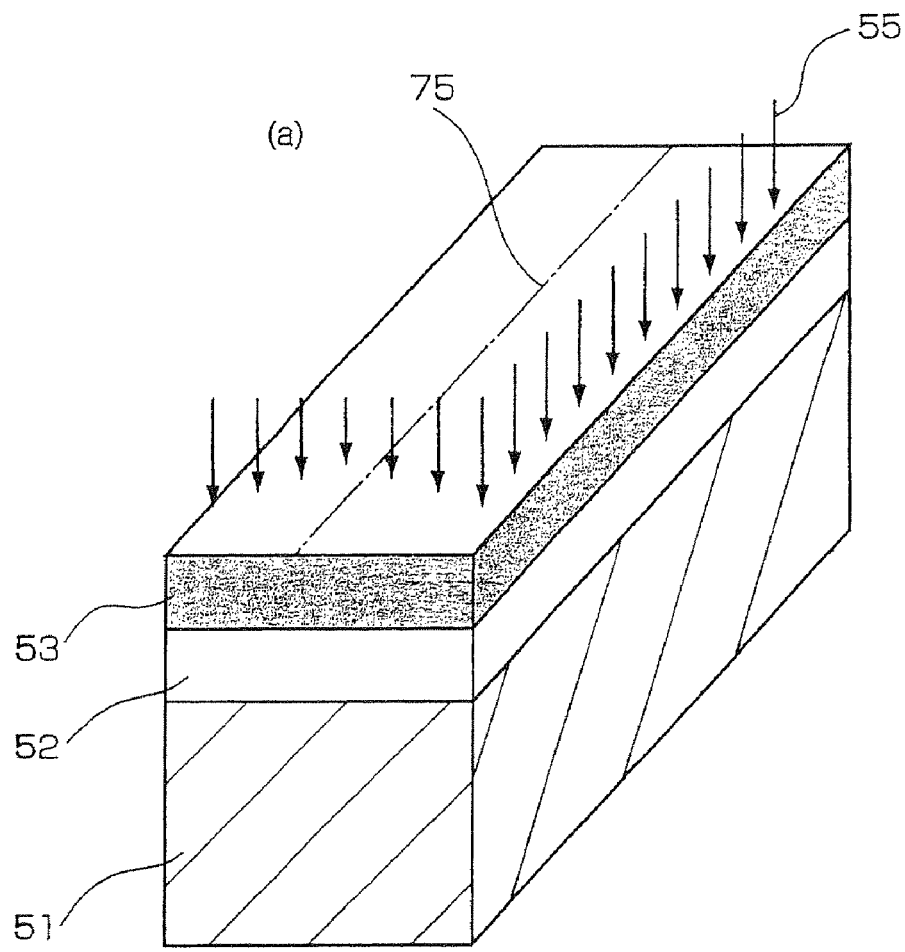
(a)
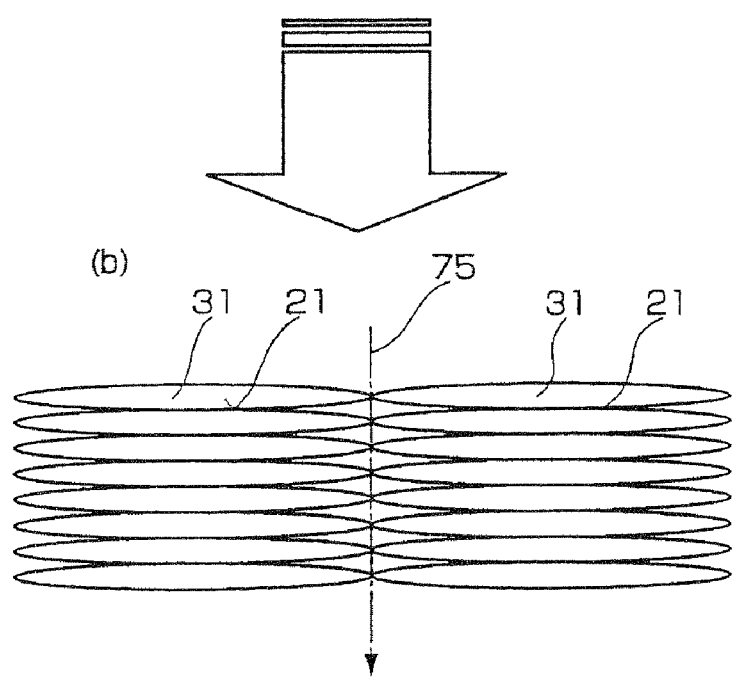
(b)

FIG. 14
(a)
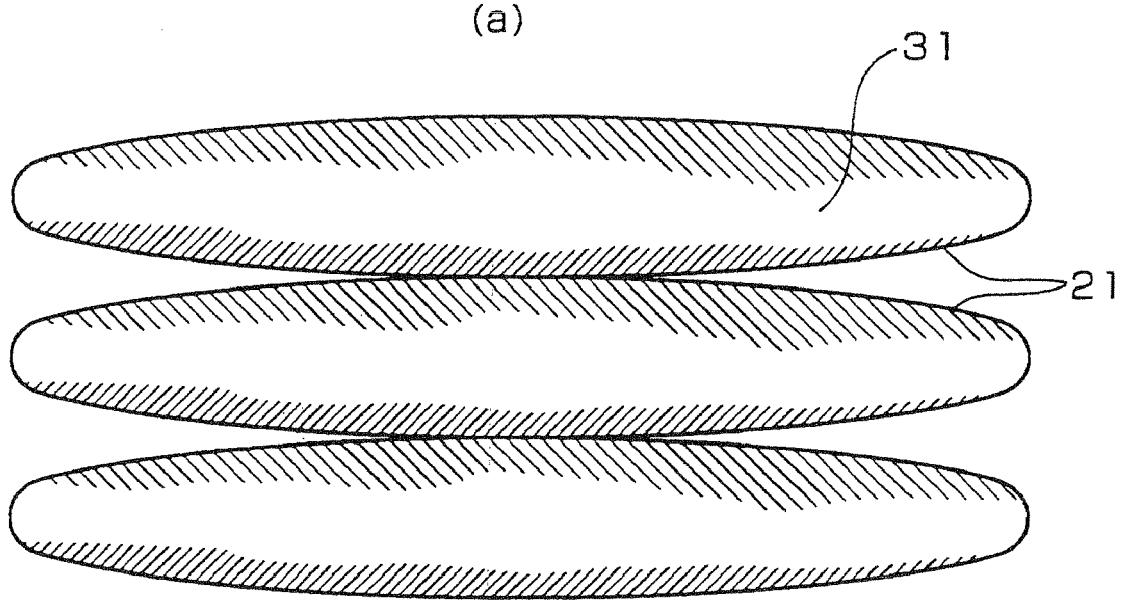
(b)
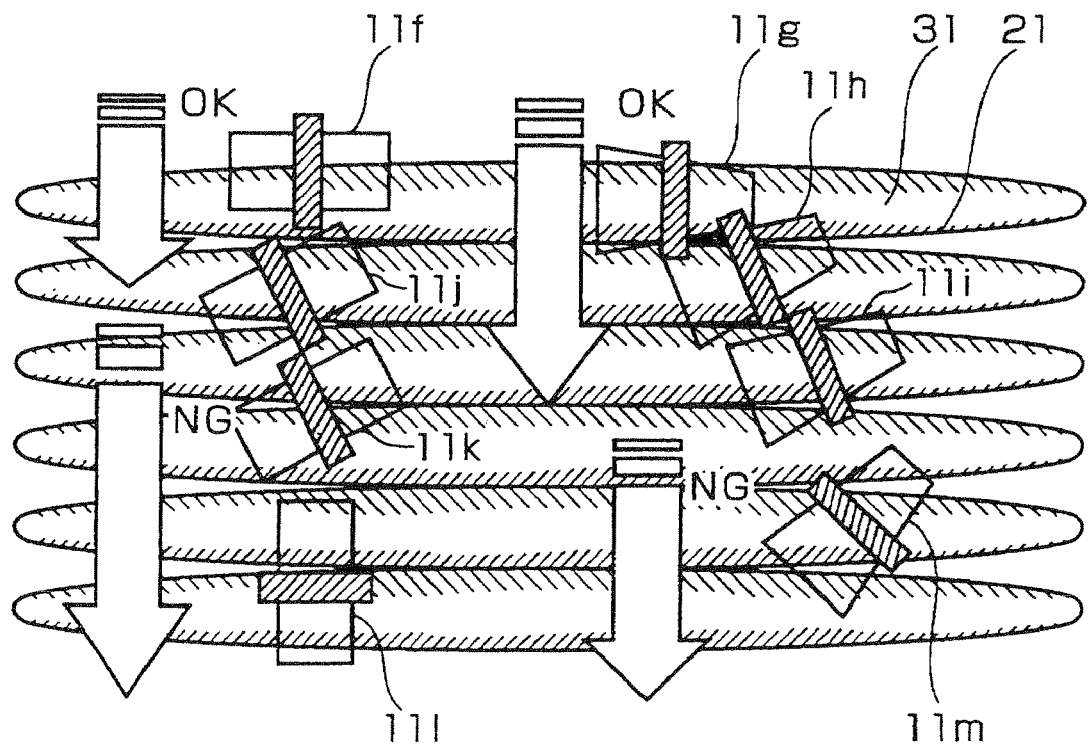

THIN FILM TRANSISTOR, CIRCUIT APPARATUS AND LIQUID CRYSTAL DISPLAY

RELATED APPLICATIONS

This application claims priority from U.S. patent application Ser. No. 10/508,818, filed Sep. 22, 2004, which claims priority from International Application No. PCT/JP03/002511, filed Mar. 4, 2003, which claims priority of Japanese Patent Application No. 2002-82451, filed on Mar. 25, 2002.

BACKGROUND OF THE INVENTION

1. Technical Field

The present invention relates to a thin film transistor, a circuit apparatus including the thin film transistor, a liquid crystal display including the thin film transistor, and a liquid crystal display including the circuit apparatus.

2. Description of Prior Art

A thin film transistor (referred to as "TFT" hereinafter) is used as, for example, a switching device for a pixel of a liquid crystal display, a component device for a peripheral circuit apparatus and so forth.

The TFT includes an active layer made of a one conductive type formed semiconductor. This active layer includes a source region as well as a drain region, both of which are formed by doping a part of the semiconductor of the active layer with high concentrated impurities. A gate electrode is formed above or below a channel region with a gate insulating film interposed therebetween, the channel region being located between these source and drain regions.

As the active layer, for example, an n-channel type poly-crystalline silicon film (Poly-Si film) is used.

So far, when forming a plurality of TFTs including an active layer having a source region and a drain region, on a sheet of substrate, there has been caused such a problem that the electrical properties of each TFT becomes uneven due to the difference in the grain size and the plane direction in each grain in the active layer. Accordingly, as a means of solving this problem, it is required to enlarge the grain size.

With regard to a method of enlarging the grain size in a semiconductor layer directly or indirectly formed on a sheet of substrate, some reports have been already made(e.g., see to Non-Patent Document 1). However, it is not possible to control the crystal orientation in the in-plane direction of the semiconductor layer by means of these techniques as disclosed.

There are some reports reporting that unevenness in the electrical property of a circuit apparatus including TFTs depends on the aforesaid crystal orientation (e.g., see Non-Patent Document 2 as shown later). This will be described referring to FIG. 15.

FIG. 15 is a schematic plan view for indicating an example of grains and grain boundaries in an active layer made of semiconductor in a prior art TFT.

In FIG. 15, there is shown a part of a semiconductor film in which, 100 denotes a grain of semiconductor, 101 a grain boundary, 102 an active layer, and 103 the flow direction of electric current flowing in the active layer 102, respectively. The active layer 102 is a layer made of one conductive type formed semiconductor.

The electrical property of the TFT varies depending on the number of the grains 100 or grain boundaries 101 in the active layer 102. When the electric current flows in the direction as shown by an arrow 103 passing through the active layer 102 including a lot of grain boundaries 101, the number of times the electric current goes across the grain boundaries 101 varies from TFT to TFT. Accordingly, there is caused such a problem that the electrical property of each TFT formed on a sheet of substrate can not become uniform.

In case of forming a TFT including such an active layer that is formed by using a part of the aforesaid Poly-Si film as the active layer 102, as it is not possible to control the crystal orientation of each silicon grain 100 in the active layer, it is so difficult to reduce the unevenness in the electrical property due to the different plane direction. Especially, when the channel length is small, as the occupation rate that one grain 100 occupies the active layer 102 becomes large, there is caused such a problem that it is not possible to lessen the unevenness in the electrical property of the prior art TFT.

Furthermore, there are some papers reporting that the unevenness in the electrical property of each TFT like this is caused by that the grain boundary 101 forms a high potential barrier height in the active layer 102 made of polycrystalline silicon, thereby lowering the field-effect mobility of the TFT (e.g., see Non-Patent Document 3).

The grain boundary 101 standing in the direction crossing the moving direction of electron or hole as a carrier of electric charge and the grain boundary 101 standing in the almost same direction as the moving direction give different influence to the electrical property of the TFT, respectively.

As a result, even if the TFT is formed on an identical substrate, there is caused such a problem that the electrical property of the TFT becomes different.

Non-Patent Document 1: Masakiyo Matsumura "Preparation of Ultra-Large Grain Silicon Thin-Films by Excimer-Laser" (Journal of The Surface Science Society of Japan, "Surface Science," Vol. 21, No. 5, pp. 278-287 (pp. 34-43), 2000, The Surface Science Society of Japan).

Non-Patent Document 2: Bernd Goebel et al., Electron Devices, IEEE Transactions, Vol. 48, No. 5, pp.897-905, May 2001.

Non-Patent Document 3: Levinson et al., Journal of Applied Physics, Vol. 53, No. 2, pp. 1193-1202, Feb. 1982.

Non-Patent Document 4: Research And Development Association For Future Electron Devices Incorporated Foundation, "Research And Development Project on Three-Dimension Integrated Circuit," pp. 87-104, Oct. 23, 1991.

SUMMARY OF THE INVENTION

An object of the invention is to provide a TFT, a circuit apparatus including the TFT, a liquid crystal display including the TFT, and a liquid crystal display including the circuit apparatus, the unevenness in the electrical property of all the above-mentioned TFTs being made less.

A semiconductor device according to the invention includes a substrate; a one conductive type semiconductor layer provided on the substrate and having a sectorial or trapezoidal shape of which an opening angle is 20 degrees or more; and a transistor provided on the one conductive type semiconductor layer. According to the invention, there becomes small the unevenness in the field-effect mobility of the transistor.

A TFT according to the invention includes a one conductive type semiconductor layer; a source region and a drain region which are separately provided in the semiconductor layer; and a gate electrode provided above or below the semiconductor layer with an insulating film interposed therebetween, wherein the width of the junction face between the source region and a channel region that is provided between the source region and the drain region, is different from the width of the junction face between the channel region and the drain region.

According to the invention, it is possible to obtain such an effect that the unevenness in the field-effect mobility of the TFT becomes small.

It is preferable that the semiconductor layer has an approximately trapezoid or approximately sector plane shape.

It is preferable that the trapezoid or sector plane shape has an opening angle of 20 degrees or more. In the trapezoid, the opening angle is an angle made by two non-parallel lines.

It is preferable that the semiconductor layer includes one or more grain boundaries, which extend in the direction from the source region to the drain region or from the drain region to the source region of the semiconductor layer.

It is preferable that the semiconductor layer includes two or more grain boundaries, each of which extends in the direction from the source region to the drain region or from the drain region to the source region of the semiconductor layer and also, each of which extends in the in-plane direction of the semiconductor layer in correspondence with the opening angle of the trapezoid or sector.

It is preferable that the semiconductor layer includes two or more grain boundaries, each of which extends in the direction from the source region to the drain region or from the drain region to the source region of the semiconductor layer, and also, two grain boundaries adjacent to each other extend in the in-plane direction of the semiconductor layer with an opening angle.

It is preferable that the semiconductor layer includes two or more grain boundaries, each of which extends in the direction from the source region to the drain region or from the drain region to the source region of the semiconductor layer, and also, two grain boundaries adjacent to each other are in parallel with the in-plane direction of the semiconductor layer.

It is preferable that the difference between two angles is 20 degrees or more, one of the two angles being an angle made by one imaginary line connecting the middle position of the width of the junction face between the channel region and source region with the middle position of the width of the junction face between the channel region and the drain region and the other imaginary line extending in the extending direction of the grain boundary, and the other angle being an opening angle defined by the width of the junction face between the channel region and the source region and the width of the junction face between the channel region and the drain region.

A circuit apparatus according to the invention includes a substrate; a TFT formed directly or indirectly on the substrate, the TFT being of N-type; and a TFT formed directly or indirectly on the substrate, the TFT being of P-type, wherein the TFT of N-type and the TFT of P-type are arranged to take point-symmetrical positions, respectively.

A liquid crystal display according to the invention includes the aforesaid TFT.

The other crystal liquid display according to the invention includes the aforesaid circuit apparatus.

The other circuit apparatus includes a substrate; a semiconductor film having a lot of grain boundaries and provided on the substrate; and a TFT which is formed in the semiconductor film, and in which electric current flows in parallel with the direction of one of the grain boundaries.

The other circuit apparatus includes a substrate; a semiconductor film provided on the substrate and having a lot of grain boundaries; and a plurality of TFTs which are formed in the same crystal orientation of the semiconductor film and in which electric current flows in parallel with the direction of each of the grain boundaries.

BRIEF DESCRIPTION OF THE DRAWINGS

In the drawings:

FIG. 11 shows illustrations of a complementary type circuit apparatus according to the embodiment 2 of the invention, wherein (a) is a plan view showing the complementary type circuit apparatus according to the embodiment 2 of the invention and (b) is a circuit diagram thereof.

FIG. 13 shows illustrations of the embodiment 3 according to the invention, wherein (a) is a schematic perspective view indicating a laser irradiation method different from FIG. 8(c), and (b) is a schematic plan view showing the grain resulting from the above method according to the embodiment 3 of the invention.

FIG. 14 shows illustrations of long and slender grains, wherein (a) is a schematic plan view showing long and slender grains in which a plurality of grain boundaries extend in parallel, (b) is a schematic plan view showing various examples on the arrangement of the active layer in long and slender grains.

PREFERRED EMBODIMENTS OF THE INVENTION

Some embodiments of the invention will now be described in detail with reference to the accompanying drawing. In the figures referred to for explanation of the invention, a thing having like function is denoted with a like numeral or sign and the repetitive explanation thereabout will be omitted.

An active layer formed to decrease the unevenness in the electrical property of a TFT depending on the plane direction of the semiconductor of which the active layer made, has an approximately trapezoid (referred to as "trapezoidal" hereinafter) plane shape or an approximately sector (referred to as "sectorial" hereinafter) plane shape. A semiconductor layer as formed such that an opening angle of the trapezoidal or sectorial shape exceeds a certain angle, has an advantage in that there are averaged various plane direction of crystals or grains in the semiconductor. "Opening angle" of aforesaid trapezoid indicates an angle made by two non-parallel straight lines thereof.

When using a part of a polycrystalline silicon film including large grains as well as radially extending grain boundaries, for example, a part of a flat circular polycrystalline silicon film as the active layer, for example, the following advantage is attainable. As will be described later, by forming an N-type TFT in the first sectorial active layer and forming a P-type TFT in the second sectorial active layer to make them be point-symmetrically arranged within a one grain so as to relatively face to each other, it becomes possible to make up a complementary type circuit apparatus (referred to as "CMOS apparatus" hereinafter) having more excellent complementarity comparing with the prior art one. TFTs, CMOS apparatuses, diodes, transistors and so forth may be formed in the trapezoidal or sectorial semiconductor layer.

The relation between the opening angle of the aforesaid sector and the aforesaid mobility has been examined referring to the study on the plane direction of the semiconductor crystal and the field-effect mobility, which is disclosed in the non-patent document 2.

Figure 2:
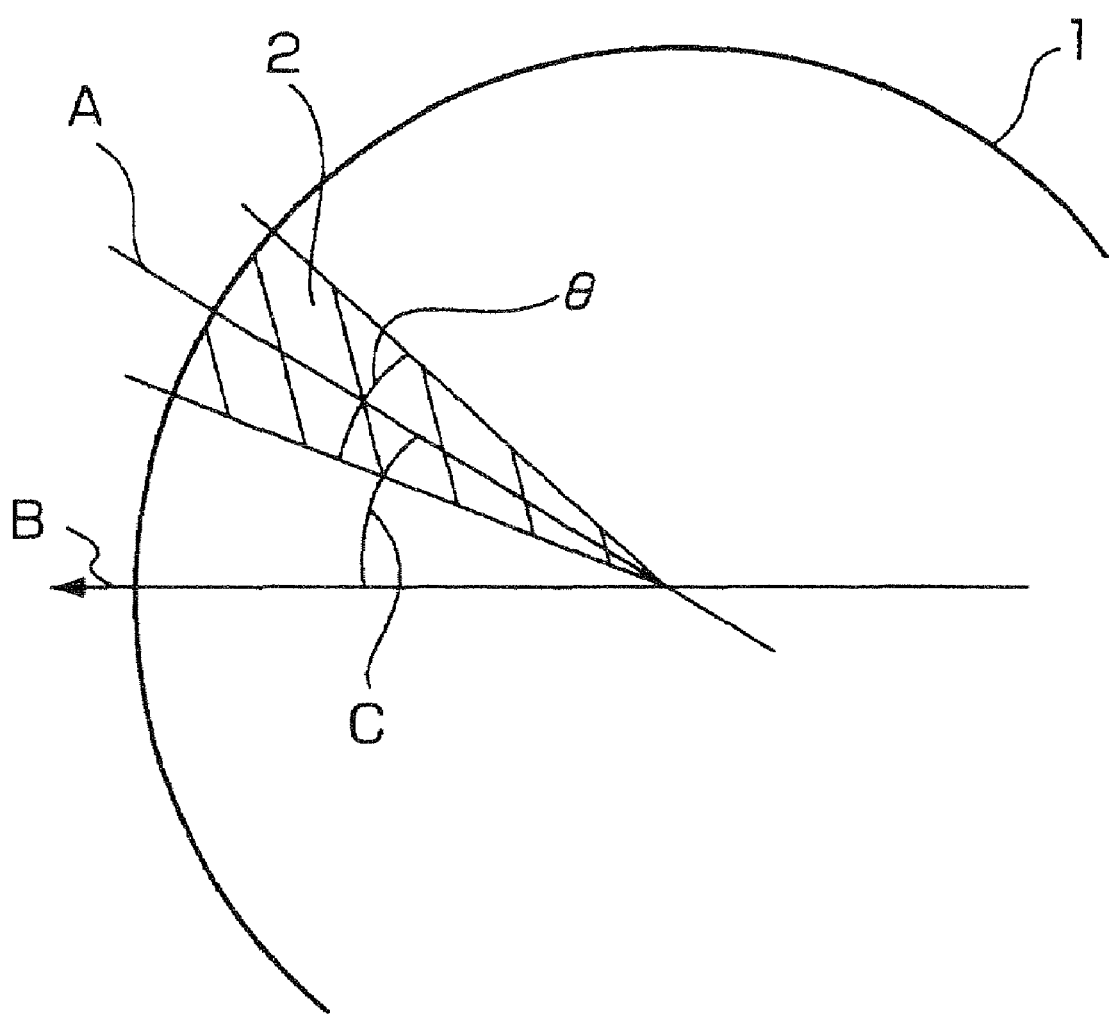
FIG. 2 shows an illustration for explaining an experiment carried out to examine a relation between an angle as made by the center axis and the (001) direction of the sectorial crystal in a circular semiconductor film and the change of the field-effect mobility when varying the opening angle of the sector.

FIG. 2 shows an illustration for explaining an experiment carried out to examine a relation between an angle as made by the center axis and the (001) direction of the sectorial crystal and the change of the field-effect mobility when varying the opening angle of the sector, in letting a apart of the semiconductor such as the aforesaid polycrystalline silicon film the active layer.

In FIG. 2, 1 indicates an approximately circle (referred to as "circular" hereinafter) semiconductor film, 2 a sectorial crystal, A the center axis of a sectorial crystal, B (001) direction, θ the opening angle of the sector, and C an angle made by the center axis A of the sectorial crystal and the (001) direction B.

Figure 3:
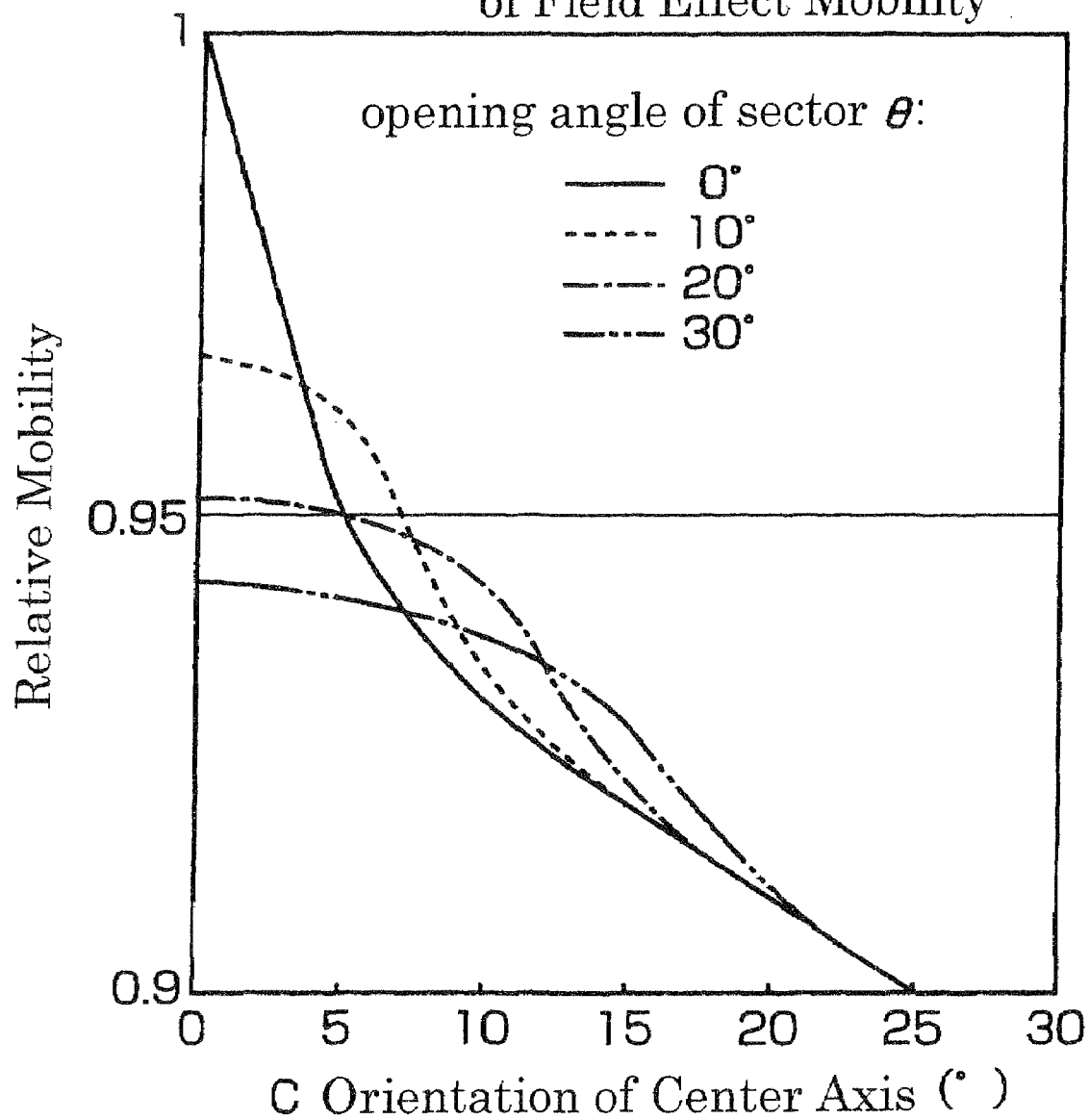
FIG. 3 is a graph showing the orientation dependence of the field-effect mobility as obtained from the experiment as explained in connection with FIG. 2, wherein there is shown the relation between the orientation of the center axis A of the sectorial crystal and the relative mobility at an opening angle θ of the sectorial shape.

FIG. 3 is a graph showing the orientation dependence of the field-effect mobility as obtained from the aforesaid experiment. There is shown the relation between the orientation of the center axis A of the sectorial crystal and the relative mobility at an opening angle θ of the sector.

As shown in FIG. 3, when the opening angle θ of the sector (FIG. 2) is large, unevenness of the aforesaid mobility is small. That is, when the center axis A of the sectorial crystal (FIG. 2) deviates from the (001) direction B, there is hardly seen difference in the aforesaid mobility. Besides, when letting the center axis A of the sectorial crystal be the (001) direction B, if the other direction is included, the unevenness becomes small. As will be understood from FIG. 3, unevenness of the aforesaid mobility is in the range of approximately 5% or less when letting the opening angle θ of the sector be 20 degrees or more.

That is, when the active layer in which the TFT is formed has a sectorial shape of which the opening angle θ is 20 degrees or more, unevenness in the mobility of the electrical property of the TFT is adequately small even if there is unevenness in the crystal orientation of the semiconductor (e.g., silicon,) in the active layer.

The aforesaid TFT includes the active layer made of semiconductor and a gate electrode which is directly or indirectly formed above or below the active layer so as to occupy at least a part of it. The active layer has a channel region located below or above the gate electrode layer, and a source region and a drain region which are located on the both side portions in the channel region.

Let an angle made by two imaginary lines Lm and Lg be α (referred to as "angle regarding the transistor direction" hereinafter), the former Lm connecting the middle position of the width of the junction face of the channel region and the source region with the middle position of the width of the junction face of the channel region and the drain region and the latter Lg extending in the direction that the grain boundary extends. Besides, let an opening angle defined by the width of the junction face of the channel region and the source region and the width of the junction face of the channel region and the drain region be β. When the active layer includes one or more grain boundaries, by locating the active layer such that the difference between α and β is 20 degrees or more, the electrical property of the TFT becomes good and unevenness in the electrical property becomes well.

Besides, if an N-type TFT formed in the first sectorial active layer and a P-type TFT formed in the second sectorial active layer are point-symmetrically arranged within a one grain such that they relatively face to each other, the electrical properties of those TFT's become equal to each other, and as described later, it becomes possible to obtain a complementary type circuit apparatus with complementarity as expected at the stage of designing it.

Embodiment 1

FIG. 1(a) is a plan view showing the schematic constitution of a TFT according to the embodiment 1, FIG. 1(b) is a sectional view of FIG. 1(a), FIG. 1(c) is a plan view showing the schematic constitution of another TFT according to the embodiment 1, and FIG. 1(d) is a sectional view of FIG. (c).

Figure 1:
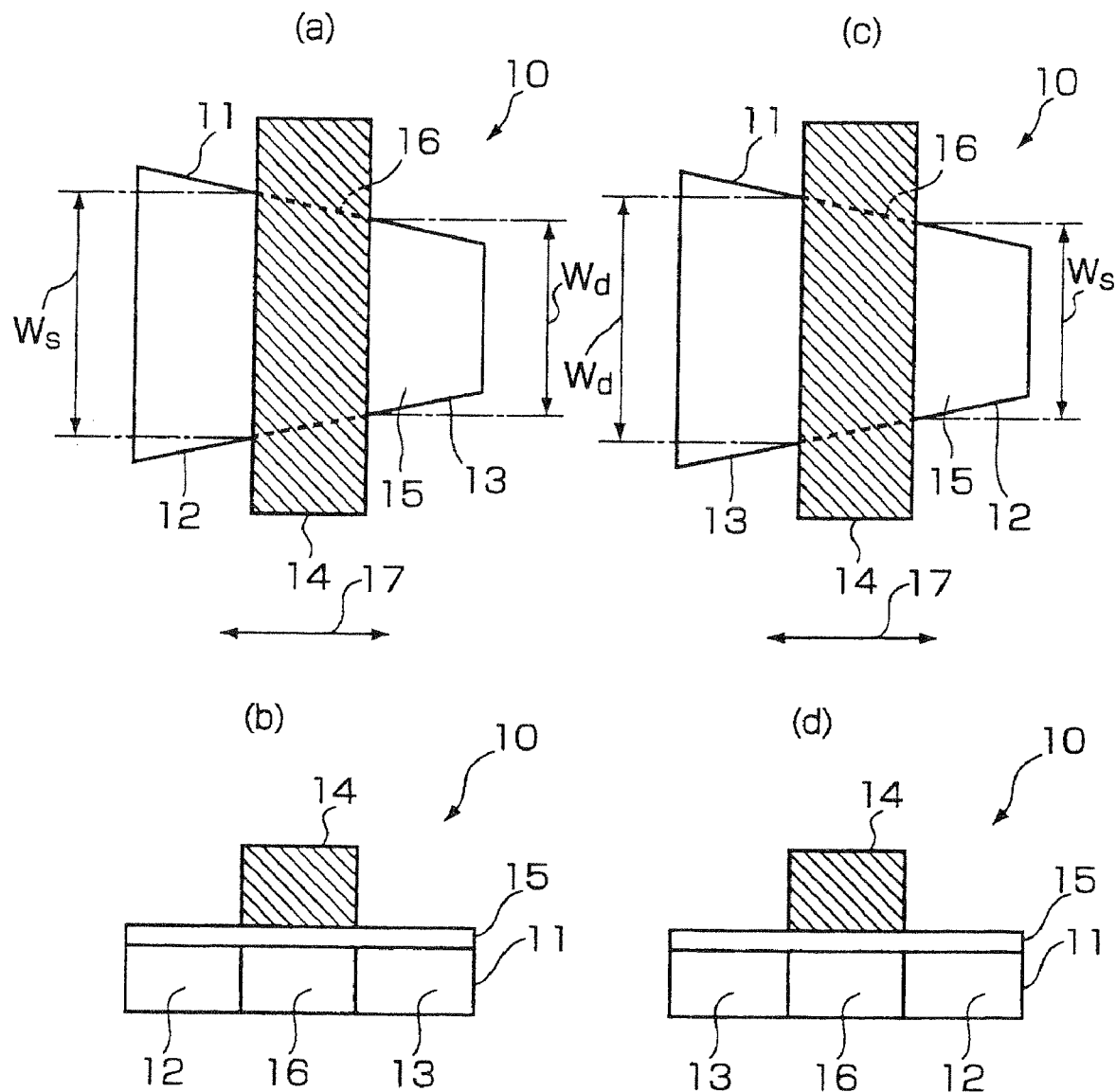
FIG. 1 shows the schematic constitution of a TFT and another TFT according to the embodiment 1 of the invention, wherein (a) indicates a plan view showing the schematic constitution of a TFT according to the embodiment 1 of the invention, (b) indicates a sectional view of (a), (c) indicates a plan view showing the schematic constitution of another TFT according to the embodiment 1, and (d) indicates a sectional view of (c).

In FIG. 1, 10 denotes a TFT, 11 an active layer made of one conductive type semiconductor, for example, an n-type silicon (Si) having an approximately trapezoid plane shape, 12 a source region formed by doping the semiconductor layer 11 with high concentrated impurities, 13 a drain region formed by doping the semiconductor layer 11 with high concentrated impurities, 14 a gate electrode provided above a channel region 16 located between the source region 12 and the drain region 13, and 15 a gate insulating film.

Also, in FIG. 1, 17 denotes the direction where the source region 12 and the drain region 13 are formed (referred to as "source-drain direction 17"). $W_s$ denotes the width of the junction face between the channel region 16 and the source region 12. In other words, $W_s$ indicates the width of the source region 12 in the vicinity of the end portion of the gate electrode 14 (including the width in the same direction). $W_d$ denotes the width of the junction face between the channel region 16 and the drain region 13. In other words, $W_d$ indicates the width of the drain region 13 in the vicinity of the end portion of the gate electrode 14. The source-drain direction 17 indicates the flowing direction of carriers from the source region 12 to the drain region 13 (i.e. channel direction).

In the embodiment 1, in the TFT including the source region 12 and the drain region 13 which are in the active layer 11 made of semiconductor and the gate electrode 14 formed above or below the channel region 16 located between the source region 12 and the drain region 13, the width $W_s$ of the junction face between the channel region 16 and the source region 12 in the vicinity of the end portion of the gate electrode 14 is different from the width $W_d$ of the junction face between the channel region 16 and the drain region 13 in the vicinity of the end portion of the gate electrode 14.

That is, $W_s > W_d$ (in FIGS. 1(a) and 1(b)) while $W_s < W_d$ (in FIGS. 1(c) and 1(d)).

The active layer 11 has an approximately trapezoid or approximately sector plane shape. These approximately trapezoid and approximately sector shapes include a shape satisfying the relation of $W_s > W_d$ or $W_s < W_d$.

In case of providing the gate electrode 14 below the active layer 11, the same explanation as made above will be applicable to it except that the gate electrode 14 is formed below the active layer 11 with the gate insulating film interposed therebetween, thus omitting an illustrations related thereto.

Figure 4:
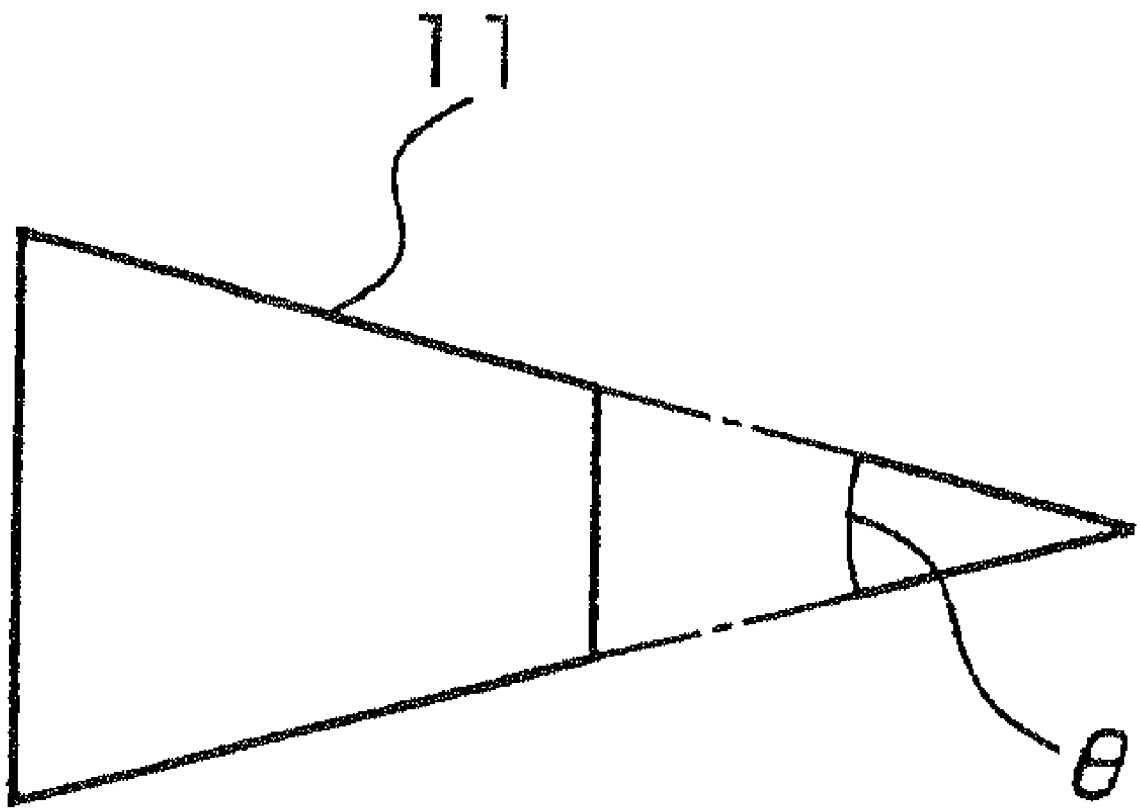
FIG. 4 is a schematic plan view showing the schematic shape of an active layer according to the embodiment 1 and the opening angle of the sector.

In FIG. 4, there are shown a schematic shape of the trapezoidal active layer 11 according to the embodiment 1 and a schematic plan view showing the opening angle θ of the trapezoidal shape.

In the embodiment 1, as shown in FIG. 4, the trapezoidal or sectorial active layer 11 has the opening angle θ of 20 degrees or more. As has been already explained referring to FIGS. 2 and 3, the more directions other than the direction the center axis A are included, the smaller the unevenness in the field effect mobility becomes. Accordingly, when the opening angle θ of the aforesaid trapezoidal shape is 20 degrees or more, the unevenness of the aforesaid field-effect mobility is in the range of approximately 5% or less, thus the unevenness in the electrical properties of TFTs becoming small. The same thing can be said with regard to the sectorial active layer.

FIGS. 5(a) through 5(d) are schematic plan views showing grain boundaries 21 in respective trapezoidal active layers 11.

Figure 5:
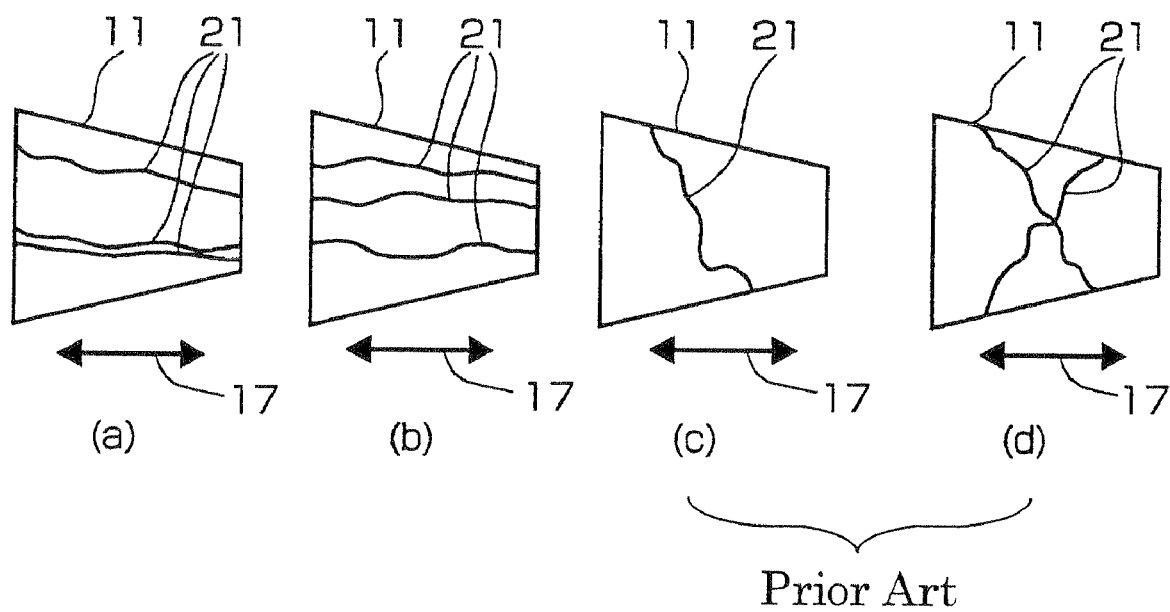
FIG. 5 shows illustrations of grain boundaries, wherein (a) through (d) are schematic plan views showing grain boundaries in respective active layers.

FIGS. 5(a) and 5(b) show grain boundaries 21 in the trapezoidal active layers 11 according to the embodiment 1. For comparison, FIGS. 5(c) and 5(d) show grain boundaries 21 in the active layers 11 according to the prior art.

In the embodiment 1, as shown in FIGS. 5(a) and 5(b), the active layer 11 is arranged such that the source-drain direction 17 of the relevant active layer 11 approximately coincides with the direction of grain boundaries in the relevant active layer 11.

In the embodiment 1, as shown in FIGS. 5(a) and 5(b), the boundaries 21 exist in the direction approximately parallel to the source-drain direction 17, that is, the moving direction of electron and hole as carrier of the electric charge. Consequently, as any potential barrier caused by the grain boundaries 21 can not exist in the carrier moving direction, the electrical property of the TFT becomes good. Contrary to this, as shown in FIGS. 5(c) and 5(d), when the grain boundaries 21 exist so as to intersect the source-drain direction 17, the electric current amount is influenced by the number of potential barriers caused by the grain boundaries 21, thereby the electrical property of the TFT becomes not good.

FIG. 6(a) is a schematic plan view showing a circular semiconductor film 1 including grain boundaries 21 which radially extend and FIG. 6(b) is a schematic plan view showing an example of arrangement of the active layers 11a through 11e in the circular semiconductor film 1.

22 indicates the direction of electric current flowing in each of the active layers 11a through 11e.

In the embodiment 1, the active layer constituting a main portion of the TFT is formed by using a part of a circular semiconductor film including grain boundaries which radially extend, for example, a part of the circular semiconductor 1 as shown in FIGS. 6(a) and 6(b). As shown FIG. 6(b), active layers 11a,11b, 11c are located in such a position that the source-drain direction 17 of the active layer (i.e. the electric current flowing direction 22) approximately coincides with the aforesaid radial direction.

As the result of this, the grain boundary 21 exists along the source-drain direction 17, that is, the moving direction of electron or hole as a carrier of electric charge, thus the electrical property of the TFT becoming good. On the contrary, as active layers 11d, 11e as shown in FIG. 6(b) are not active layers according to the embodiment 1, there exists the grain boundary 21 going across the source-drain direction 17 (i.e. the electric current flowing direction 22), thus the aforesaid electrical property is not good.

Figure 7:
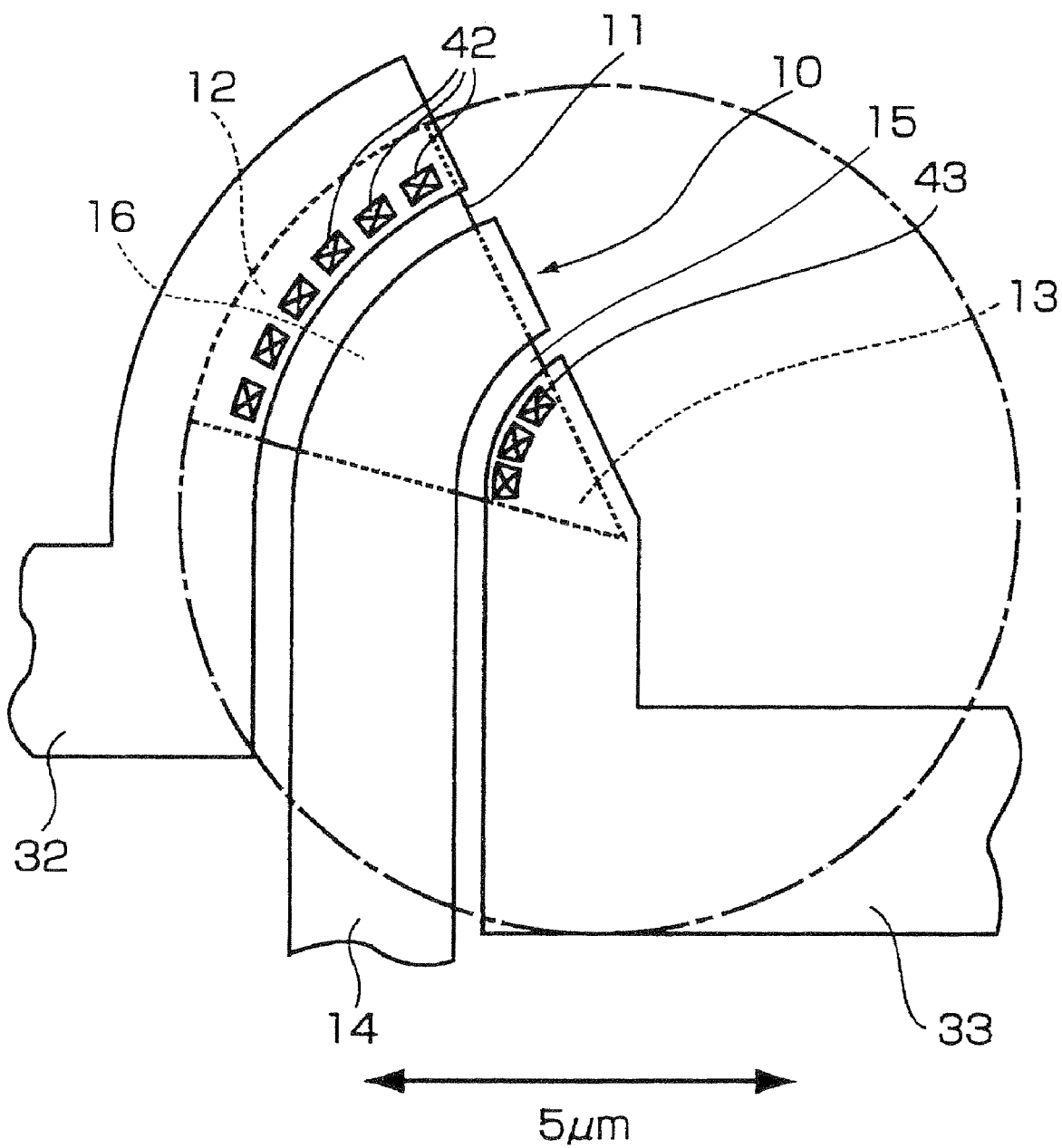
FIG. 7 is a schematic plan view showing TFTs according to the embodiment 1.

FIG. 7 is a schematic plan view showing TFTs according to the embodiment 1.

In FIG. 7, 32 denotes a source electrode, 33 a drain electrode, 42 a contact hole for electrically connecting the source electrode 32 with a source region 12, and 43 a contact hole for electrically connecting the drain electrode 33 with a drain region 13. A lot of contact holes 42 and 43 are arranged in the source region 12 and the drain region 13 in the respective width directions of them such that the electric current flows along the grain boundary 21 with uniform electric current density.

In the TFT 10 as shown in FIG. 7, the width of the source region 12 in the vicinity of the end portion of the gate electrode 14 is larger than the width of the drain region 13 in the vicinity of the end portion of the gate electrode 14. The active layer 11 has an approximately trapezoid plane shape. Although not shown, the width of the drain region 13 in the vicinity of the end portion of the gate electrode 14 may be made larger than the width of the source region 12 in the vicinity of the end portion of the gate electrode 14.

<<Manufacturing Process>>

FIGS. 8(a) through FIG. 10(r) are schematic sectional views showing the process of manufacturing the TFT according to the embodiment 1.

First of all, as shown in FIG. 8(a), a base oxide film ($SiO_2$ film) 52 with a thickness of 800 nm is formed on a glass substrate 51 for manufacturing a liquid crystal display by means of the plasma CVD method under the condition of the substrate temperature of 500° C. and the deposition time of 40 minutes.

In the next, as shown in FIG. 8(b), an a-Si (amorphous silicon) film 53 with a thickness of 100 nm for use in active layer formation is formed by mean of the LP (low pressure)-CVD under the condition of the substrate temperature of 450° C. and the deposition time of 70 minutes, during providing $Si_2H_6$ gas under the condition of the flow speed of 150 cccm and the gas pressure of 8 Pa. Then, doping with boron 54 as a dopant by means of the ion shower doping method is carried out.

Figure 8:
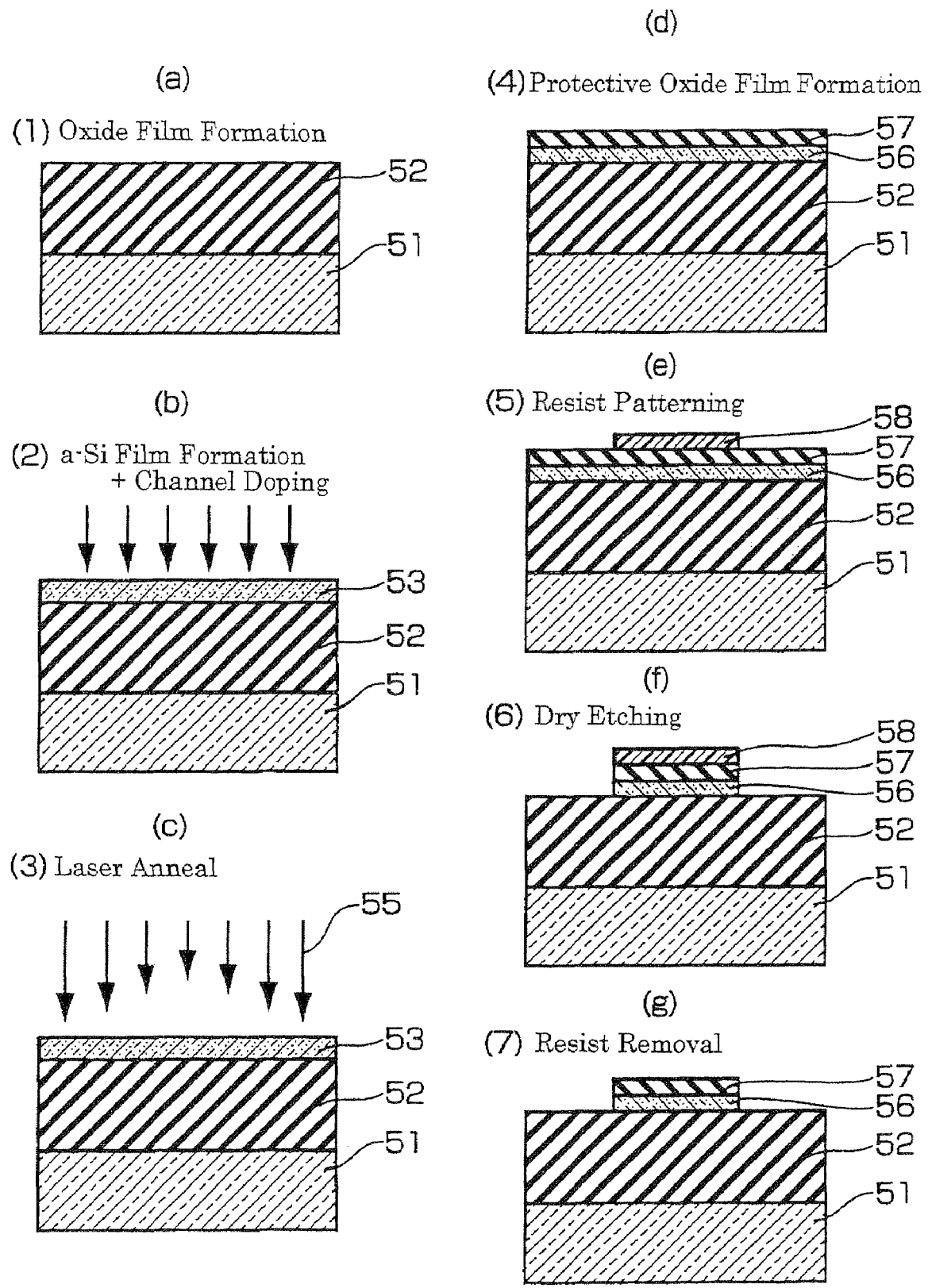
FIG. 8 shows illustrations of the manufacturing process of the TFT according to the embodiment 1, wherein (a) through (g) are schematic sectional views showing the manufacturing process of the TFT according to the embodiment 1.

Next, as shown in FIG. 8(*c*), irradiating by KrF (krypton fluoride) excimer laser light 55 with the intensity of 350 mJ·cm$^{-2}$ is carried out. With irradiation by the laser light having a coaxial circular sectional shape and the intensity made weak at center portion but made strong in peripheral portion, there is obtained a circular polycrystalline silicon film 56 (FIG. 8(*d*)) made up of grains having a large grain size.

Next, as shown in FIG. 8(*d*), a protection oxide film (SiO$_2$ film) 57 with a thickness of 10 nm is formed by means of the LP-CVD method under the condition of the substrate temperature of 500° C. and the deposition time of 10 minutes.

Next, as shown in FIG. 8(*e*), a patterned resist film 58 is formed by applying a resist material, and then carrying out exposure and development of the resist material.

Next, as shown in FIG. 8(*f*), the protection oxide film 57 and the polycrystalline silicon film 56 are processed by means of the dry etching method using BCl$_3$+CH$_4$ gas, using the resist film 58 as a mask. In this process, the protection oxide film 57 and the polycrystalline silicon film 56 are processed in the trapezoidal shape (plane shape of the active layer 11) as shown in FIGS. 1 (*a*), 1(*c*), or in the sectorial shape (plane shape of the active layer 11) as shown in FIG. 7.

Next, as shown in FIG. 8(*f*), the resist film 58 is removed as shown in FIG. 8(*g*).

Figure 9:
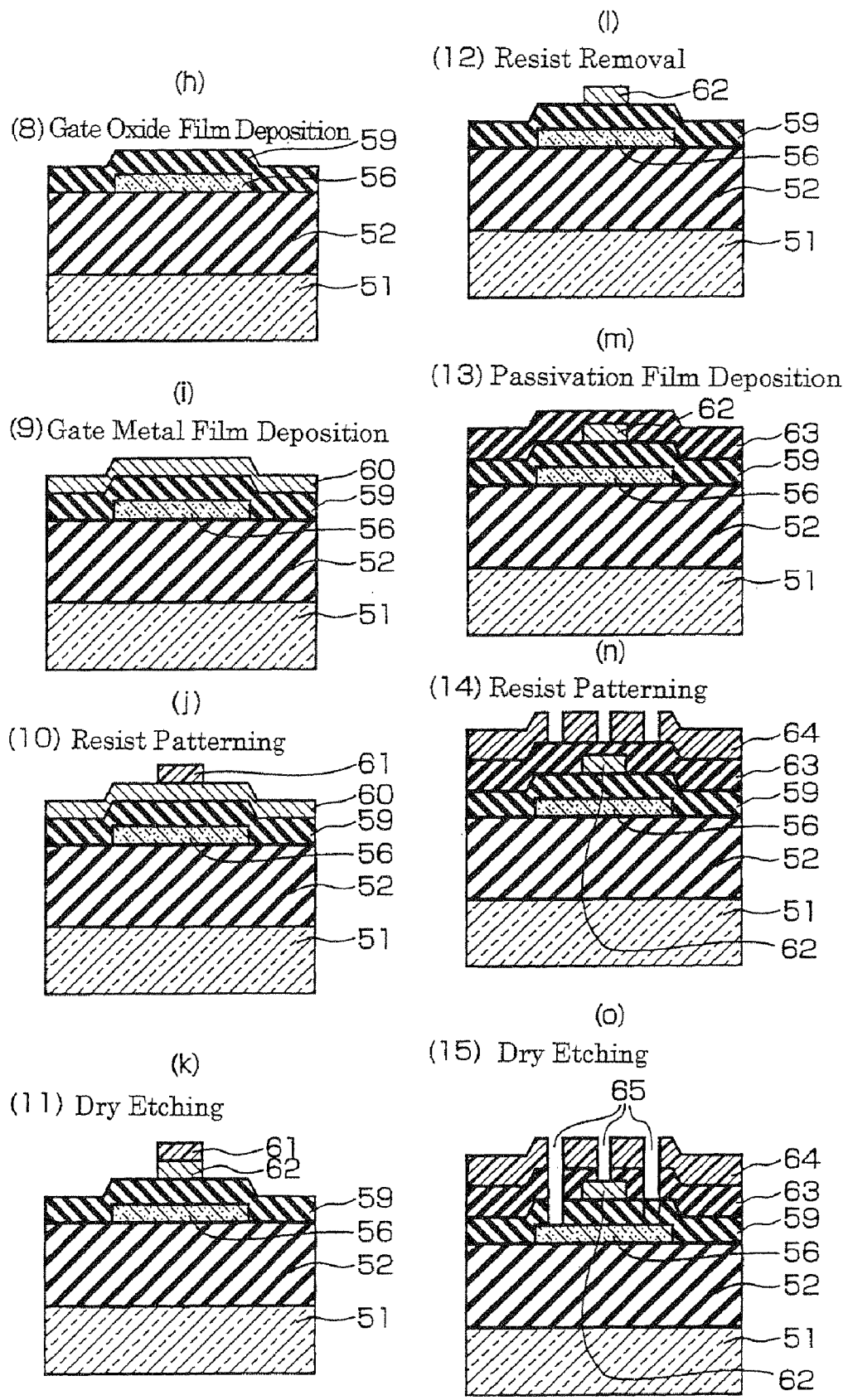
FIG. 9 shows illustrations of the manufacturing process of the TFT according to the embodiment 1, wherein (h) through (o) are schematic sectional views showing the manufacturing process of the TFT according to the embodiment 1.

Next, as shown in FIG. 9(*h*), a gate oxide film (SiO$_2$ film) 59 having a film thickness of 100 nm by mean of the LP-CVD under the condition of the substrate temperature of 500° C. and the deposition time of 60 minutes.

Next, as shown in FIG. 9(*i*), a Mo (molybdenum) film 60 having a film thickness of 100 nm for formation of a gate electrode is formed by means of the sputtering method under the condition of the substrate temperature of 100° C. and the deposition time of 10 minutes.

Next, as shown in FIG. 9(*j*), a patterned resist film 61 is formed by applying a resist material, and then carrying out exposure and development of the resist material.

Next, as shown in FIG. 9(*k*), the Mo film 60 is processed by means of the dry etching method using BCl$_3$+CH$_4$ gas, using the resist film 61 as a mask, thereby the gate electrode 62 being formed.

Figure 10:
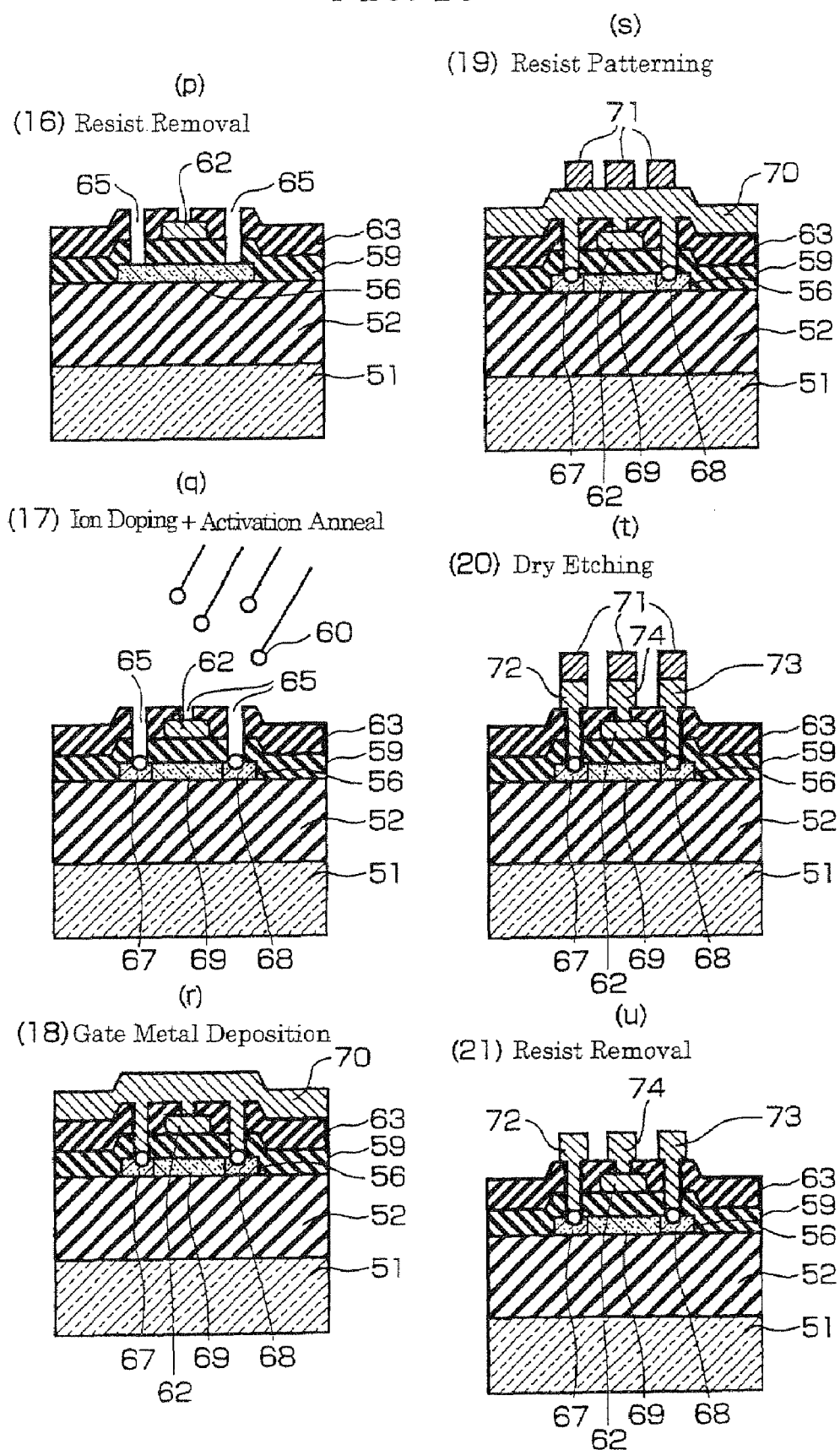
FIG. 10 shows illustrations of the manufacturing process of the TFT according to the embodiment 1, wherein (p) through (u) are schematic sectional views showing the manufacturing process of the TFT according to the embodiment 1.

Next, the resist film 61 as shown in FIG. 9(*k*) is removed as shown in FIG. 10(*l*).

Next, as shown in FIG. 9(*m*), a passivation film (SiO$_2$ film) 63 having a thickness of 200 nm is formed by the plasma CVD under the condition of the substrate temperature of 500° C. and the deposition time of 20 minutes.

Next, as shown in FIG. 9(*n*), a patterned resist film 64 is formed by applying a resist material, and then carrying out exposure and development of the resist material.

Next, as shown in FIG. 9(*o*), contact holes 65 are formed by means of the dry etching method using CHF$_3$+O$_2$ gas, using the resist film 64 as a mask.

Next, the resist film 64 as shown in FIG. 9(*o*) is removed as shown in FIG. 10(*p*).

Next, as shown in FIG. 10(*q*), after carrying out the ion doping with phosphoric 66 for forming the source region and the drain region, annealing for dopant activation is carried out for 3 hours in the nitrogen atmosphere of 500° C., thereby forming the source region 67 and the drain region 68. 69 denotes a channel region located between the source region 67 and the drain region 68.

Next, as shown in FIG. 10(*r*), an Al (aluminum) film 70 having a thickness of 100 nm for use in electrode formation is formed by means of the sputtering method under the condition of the substrate temperature of 100° C. and the deposition time of 10 minutes.

Next, as shown in FIG. 10(*s*), a patterned resist film 71 is formed by applying a resist material, and then carrying out exposure and development of the resist material.

Next, as shown in FIG. 10(*t*), the Al film 70 is processed by means of the dry etching method using BCl$_3$+CH$_4$ gas, using the resist film 70 as a mask, thereby a source electrode 72, a drain electrode 73, and a gate electrode (a take-up electrode from the gate electrode 62) 74 being formed.

Finally, the resist film 71 as shown in FIG. 10(*t*) is removed as shown in FIG. 10(*u*). With this, the TFT 10 is manufactured.

Embodiment 2

FIG. 11(*a*) is a plan view showing a complementary type circuit apparatus (referred to as "CMOS apparatus herein after)" and FIG. 11(*b*) is a circuit diagram thereof.

In these figures, 80 denotes a complementary type circuit apparatus, 81 a P-type TFT, 82 an N-type TFT, 91 a source electrode connected with the source region 83 of the P-type TFT 81, 92 an input electrode connected with the gate electrodes 84 of the P-type TFT 81 as well as with the gate electrode 85 of the N-type TFT 82, 93 an output electrode connected with the drain region 86 of the P-type TFT 81 as well as with the drain region 87 of the N-type TFT 82, and 94 a source electrode connected with the source region 88 of the N-type TFT 82.

A lot of contact holes 95, 98, 96, 97 are arranged respectively in the source regions 83, 88 and the drain regions 86, 87 in the respective width directions of them such that the electric current flows along the grain boundary 21 with uniform electric current density.

In the P-type TFT 81 of the complementary type circuit apparatus 80 as shown in FIG. 11(*a*), the width of the source region 83 in the vicinity of the end portion of the gate electrode 84 is larger than the width of the drain region 86 in the vicinity of the end portion of the gate electrode 84. An active layer 89 has am approximately sector plane shape. In the N-type TFT 82 of the complementary type circuit apparatus 80, the width of the source region 88 in the vicinity of the end portion of the gate electrode 85 is larger than the width of the drain region 87 in the vicinity of the end portion of the gate electrode 85. An active layer 90 has an approximately sector plane shape.

That is, in the embodiment 2, the N-type TFT 82 and the P-type TFT 81 respectively having an approximately sector plane shape are formed on a circular semiconductor film 1 composed of one grain such that they are point-symmetrically located at respective points facing to each other, thereby constituting the complementary type circuit apparatus.

In the embodiment 2, as the semiconductor film 1 is composed of one grain, it becomes possible to obtain the complementary type circuit apparatus 80 having more excellent complementarity comparing with the prior art.

<<Manufacturing Process>>

Figure 12:
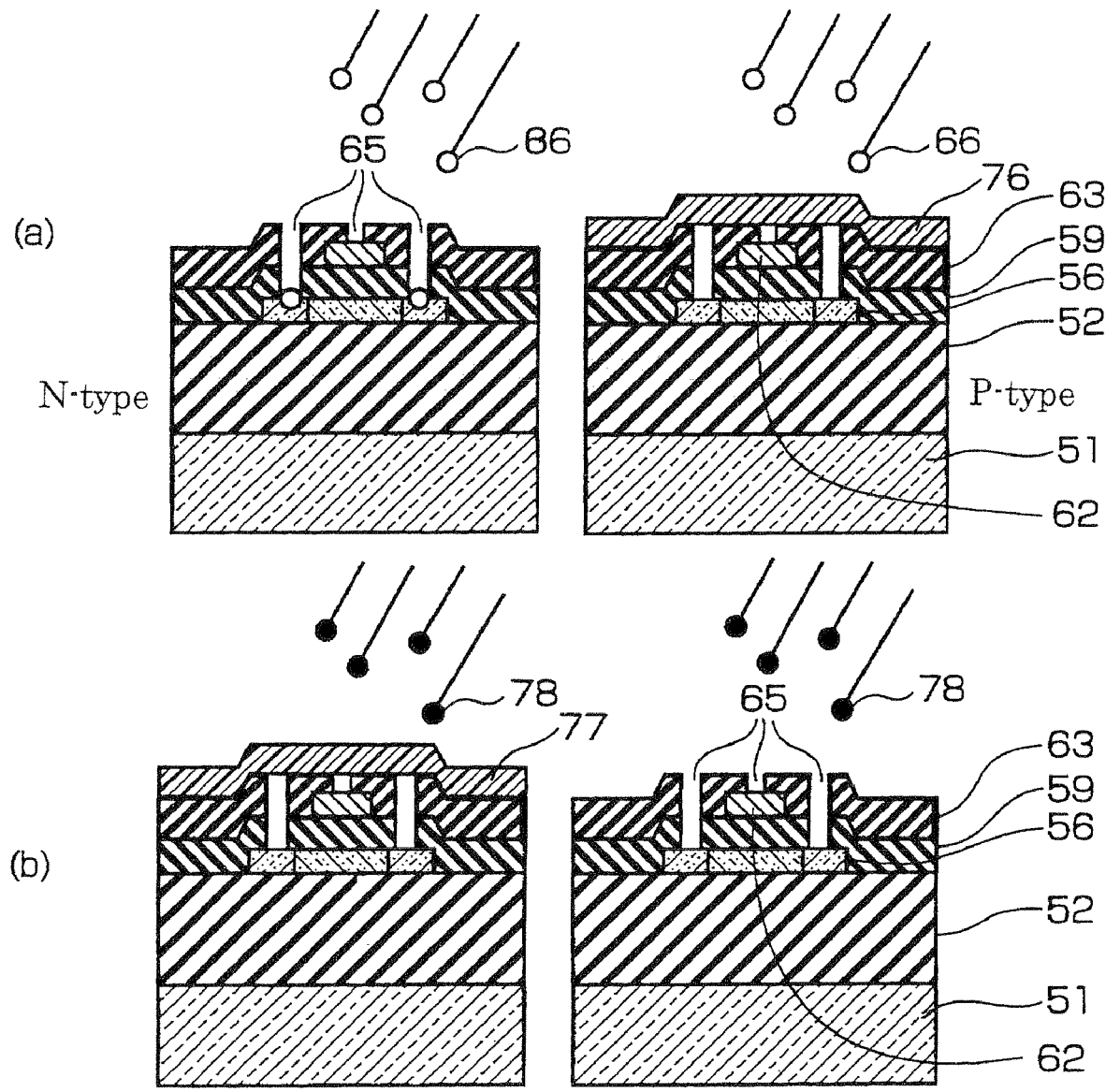
FIG. 12 shows illustrations of the manufacturing process of a complementary type circuit apparatus according to the embodiment 2 of the invention, wherein (a) and (b) are schematic sectional views showing the manufacturing process of the complementary type circuit apparatus according to the embodiment 2 of the invention.
Figure 15:
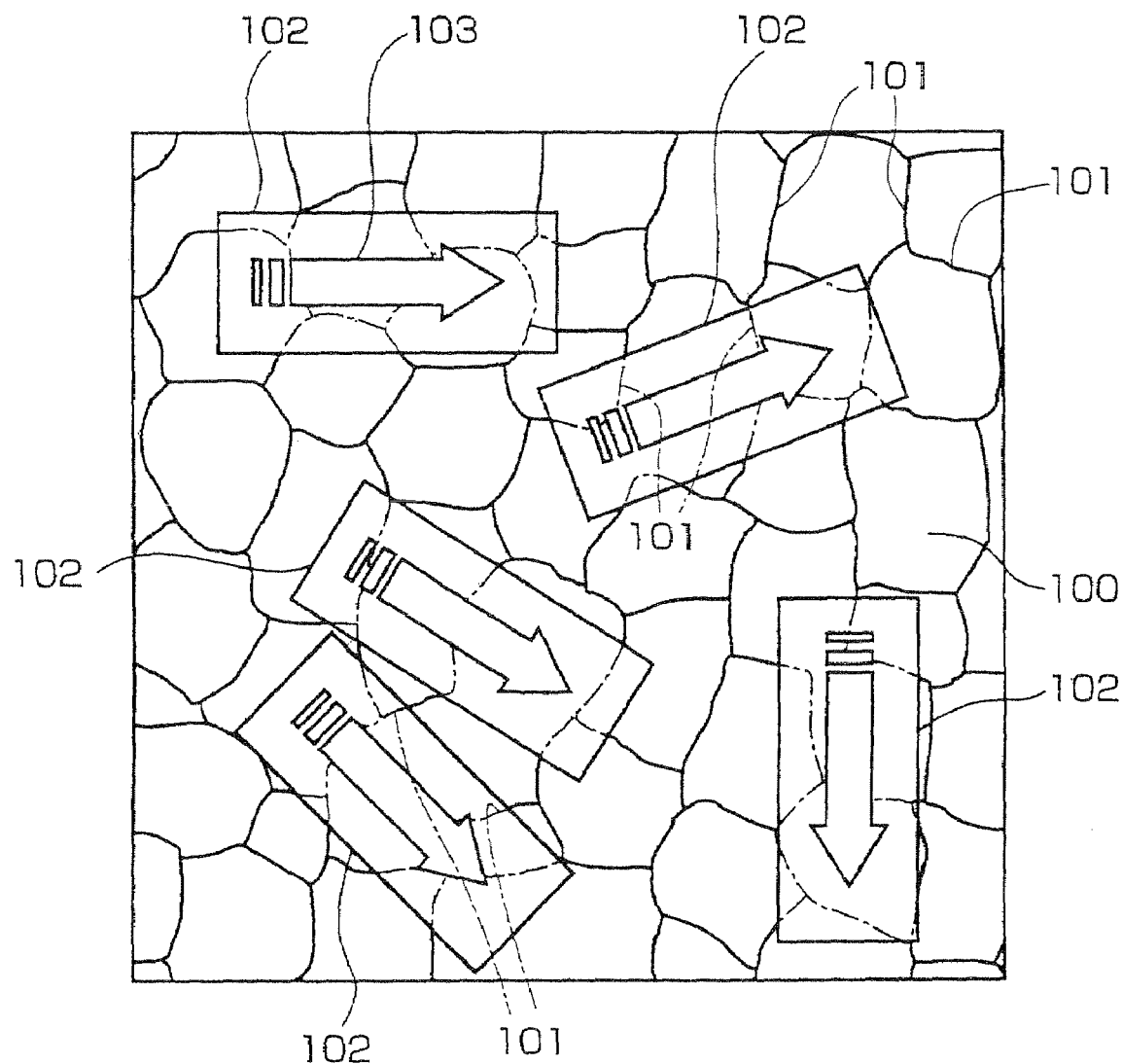
FIG. 15 is a schematic plan view for explaining an example of grains and grain boundaries in the active layer made of semiconductor in a prior art TFT.

FIGS. 12(*a*) and 12 (*b*) are schematic sectional views showing the manufacturing process of the complementary type circuit apparatus according to the embodiment 2 of the invention.

In the embodiment 2, the ion doping process as shown in FIG. 10(*q*) in the manufacturing process of the embodiment 1, after masking a TFT 81 to be made P-type with the resist film 76 for preventing it from being doped, only a TFT 82 to be made N-type is doped with, for example, phosphor 66 Then, reversely, after masking a TFT 82 to be made the N-type with the resist film 77 for preventing it from being doped, only a TFT 81 to be made P-type is doped with, for example, boron 78.

After the above doping process, annealing for dopant activation is carried out for 3 hours in the nitrogen atmosphere of 500° C.

Embodiment 3

Figure 6:
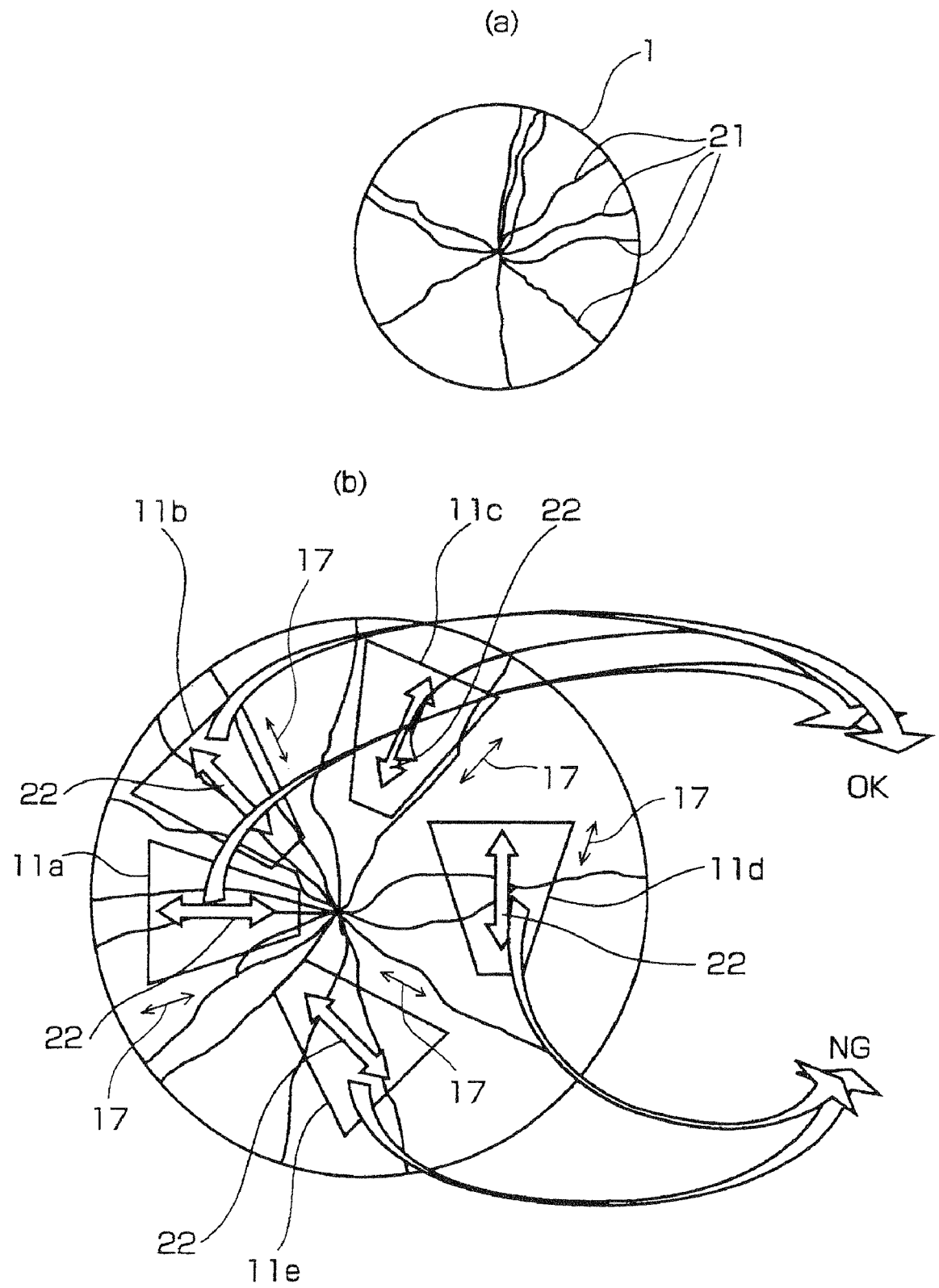
FIG. 6 shows illustrations of circular semiconductor films, wherein (a) is a schematic plan view showing a circular semiconductor film including radially extending grain boundaries and (b) is a schematic plan view showing an example of arrangement of the active layer in the circular semiconductor film.

In the manufacturing process shown in FIG. 8(*c*) in the aforesaid embodiment 1, as regards irradiating the a-Si film 53 by KrF excimer laser light 55 as shown in FIG. 8(*c*) to obtain a polycrystalline silicon film 56 (FIG. 8(*d*)), with irradiation by the laser light having a coaxial circular sectional shape and the intensity made weak at center portion but made strong in peripheral portion, there is obtained a circular-shape polycrystalline silicon film 56 (FIG. 8(*d*)) made up of large grains. This polycrystalline silicon film 56 corresponds to the circular semiconductor film 1 as shown in FIG. 2, FIGS. 6(*a*), 6(*b*), and FIG. 7.

FIG. 13(*a*) is a schematic perspective view indicating another irradiation method by KrF excimer laser 55, and FIG. 13(*b*) is a schematic plan view showing the grain resulting from the above irradiation method.

As shown in FIG. 13(*a*), the irradiation is carried out by KrF excimer laser light 55 with the intensity of 350 mJ·cm$^{-2}$. By adjusting the laser light intensity to become weak on a center line 75 but to become stronger in the direction toward the outside, there is obtained, as shown in FIG. 13(*b*), the polycrystalline silicon film having large grains 31 extending from a center line 75 in the direction at right angles thereto. In the semiconductor film having long and slender grains 31, the grain boundaries 21 extend in parallel with each other.

FIG. 14 (*a*) is a schematic plan view showing long and slender grains 31 as shown in FIG. 13 (*b*), in which grain boundaries 21 extend in parallel with each other. FIG. 14(*b*) is a schematic plan view showing several examples of arrangement of the active layer 11 in long and slender grains 31.

In the figure, the more upward the active layer 11 is located, the better the electrical property of the TFT including this active layer becomes. On the contrary, in the figure, the more downward the active layer 11 is located, the worse the above-mentioned electrical property becomes.

That is, in the embodiment 1, the active layer constituting the main portion of the TFT is a layer made of semiconductor in which grain boundaries extend in parallel to each other. Grains are, for example, long and slender grains 31 as shown in FIGS. 14(*a*) and 14(*b*). Active layers 11g, 11h, 11i, 11m have an approximately trapezoid plane shape. For comparison, it is shown that active layers 11f, 11j, 11k, 11l have a rectangular plane shape.

The source-drain direction (i.e., electric current flowing direction) of active layers 11f, 11g, 11h, 11i is arranged along the aforesaid parallel direction. With this, as the grain boundary 21 exists along the source-drain direction 17, that is, the moving direction of electron or hole as a carrier of electric charge, the electrical property of the TFT becomes good.

As compared with this, active layers 11j, 11k, 11l, 11m as shown in FIG. 14(*b*) include the grain boundary 21 going across the source-drain direction at a high rate, the electrical property becomes not good.

When the aforesaid active layer includes one or more grain boundaries, if the active layer is arranged such that the difference between the following two angles becomes 20 degrees or more, one of two angles being an angle (referred to as "angle regarding the transistor direction" hereinafter) made by one imaginary line connecting the middle position of the width of the junction face between the channel region and source region with the middle position of the width of the junction face between the channel region and the drain region and the other imaginary line extending in the extending direction of the grain boundary, and the other being an opening angle defined by the width of the junction face between the channel region and the source region and the width of the junction face between the channel region and the drain region, the electrical property of the TFT becomes good and unevenness in the electrical property becomes small.

Accordingly, a high performance liquid crystal display can be realized by using the TFT as described above as a switching device for each pixel in the liquid crystal display, or as a component device of a peripheral circuits apparatus.

While some embodiments of the invention have been shown and described in the above with reference to the accompanying drawings, the invention is not limited to those embodiments. Various changes and modifications will be naturally possible without departing from the gist of the invention.

The invention claimed is:

1. A thin film semiconductor device, comprising:
   a substrate;
   a polycrystalline silicon film provided on said substrate and having plural long and slender grains having a longitudinal grain direction; and
   a thin film transistor having an active layer in said amorphous silicon film;
   wherein a grain boundary between said grains adjacent to each other extends along the longitudinal direction of said grains;
   wherein said thin film transistor has a source region and a drain region having width directions and arranged at intervals from each other along said grain boundary in said active layer, a source electrode connected with said source region through multiple contact holes, and a drain electrode connected with said drain region through multiple contact holes; and
   wherein said contact holes are arranged respectively in said source region and said drain region in the respective width directions of said source region and said drain region in each said grain such that an electric current density becomes uniform.

2. A thin film semiconductor device as claimed in claim 1, further comprising:
   another thin film transistor having components similar to those of said thin film transistor,
   wherein one thin film transistor is an N-type thin film transistor and the other is a P-type thin film transistor,
   said N-type and P-type thin film transistors constituting a complementary type circuit formed so as to be point-symmetric with respect to each other in one grain.

3. A thin film semiconductor device as claimed in claim 1, in which said contact holes are arranged to facilitate uniform electric current density in electric current flow along the grain boundary.

4. A thin film semiconductor device as claimed in claim 2, in which said contact holes are arranged to facilitate uniform electric current density in electric current flow along the grain boundary.

* * * * *

UNITED STATES PATENT AND TRADEMARK OFFICE
CERTIFICATE OF CORRECTION

| | | |
|---|---|---|
| PATENT NO. | : 7,608,891 B2 | Page 1 of 1 |
| APPLICATION NO. | : 11/469748 | |
| DATED | : October 27, 2009 | |
| INVENTOR(S) | : Hiramatsu et al. | |

It is certified that error appears in the above-identified patent and that said Letters Patent is hereby corrected as shown below:

Column 12

Line 30, (Claim 1, Lines 6-7), Change "amorphous" to --polycrystalline--.

Signed and Sealed this

Ninth Day of March, 2010

David J. Kappos
*Director of the United States Patent and Trademark Office*